United States Patent [19]
Lim et al.

[11] Patent Number: 4,794,568
[45] Date of Patent: Dec. 27, 1988

[54] REDUNDANCY CIRCUIT FOR USE IN A SEMICONDUCTOR MEMORY DEVICE

[75] Inventors: Hyung-Kyu Lim, Suwon; Jae-Yeong Do, Dongjak, both of Rep. of Korea; Rustam Mehta, Sunnyvale, Calif.

[73] Assignee: SamSung Semiconductor & Telecommunication Co., Ltd., Seoul, Rep. of Korea

[21] Appl. No.: 44,702

[22] Filed: May 1, 1987

[30] Foreign Application Priority Data

May 7, 1986 [KR] Rep. of Korea .................. 86-3537

[51] Int. Cl.$^4$ .............................................. G11C 7/00
[52] U.S. Cl. .................................... 365/200; 365/210
[58] Field of Search ............... 365/200, 210; 371/10, 371/11

[56] References Cited

U.S. PATENT DOCUMENTS 4,422,161 12/1983 Kressel et al. ...................... 365/200
4,514,830 4/1985 Hagiwara et al. .................. 365/200

Primary Examiner—Joseph A. Popek
Attorney, Agent, or Firm—Robert E. Bushnell

[57] ABSTRACT

A normal decoder and a redundant decoder having address program devices are used for the replacement of bad cells. The number of address program devices is one more than the number of input address bits for selecting a normal row or column. The input signals of the additional program device are complementary to the input signals of one of the other program devices. The program of the program devices have two steps to repair the faulty cells. To increase the reliability of redundancy, a nonvolatile memory element used in the program devices is a bridge connected four cell FLO-TOX type nonvolatile memory device.

19 Claims, 4 Drawing Sheets

REDUNDANCY CIRCUIT FOR USE IN A SEMICONDUCTOR MEMORY DEVICE

BACKGROUND OF THE INVENTION

1. Field of the Invention

The present invention relates to semiconductor circuits, and more particularly, to a circuit for replacing defective cells with redundant cells in a semiconductor memory device.

2. Description of the Prior Art

Recently, in a large scale semiconductor memory device, in order to increase the reduced production yield caused by defects in memory cells generated during the manufacturing process which often render the entire chip useless, redundancy schemes are widely used.

Redundancy is to provide an on-chip spare memory array in addition to a normal memory array, and, when one or more memory cells in the normal memory array are faulty, to replace rows or columns containing the defective normal memory cell or cells with rows or columns containing the defect-free redundant cell or cells.

Currently, the substitution of good cells for defective cells in normal memory arrays is implemented by electrically or physically disconnecting faulty rows or columns of cells from the normal memory array and electrically connecting redundant rows or columns to the row or column address decoder in such a manner that each responds to the address bit pattern which formerly selected the faulty row or column. Such redundancy is performed either before or after packaging of the memory chip and has been accomplished by using one of two methods, i.e., one of blowing polysilicon fuses by use of pulses of electrical current, and the other of vaporization of conductor material with accurately focused laser beam spots.

However, as memory arrays become more dense and line widths grow smaller, the laser redundancy technology has the problem of requirement for highly expensive apparatus accurately controlling the magnitude and the position of the laser beam spots. Meanwhile, the electrically polysilicon fuse-blowing redundancy has another problem of arranging as well additional circuits on the same chip for supplying so large currents as to cut open polysilicon fuses as pheripheral circuits while protecting those circuit elements from destruction by large fuse blowing current. This creates the drawback of an enevitable increase in chip size or area.

In addition to the above mentioned redundancy schemes, there has been another one which is to substitute redundant rows or columns for defective rows or columns by programming nonvolatile memory elements so as to be selectively enabled the corresponding redundant row or column whenever the row or column having defective normal memory cells is addressed.

Various circuits for performing such substitution are set forth in U.S. Pat. Nos. 4,422,161 to Kressel et al. and 4,514,830 to Hagiwara et al. However, these patents need to employ a plurality of nonvolatile memory elements for the replacement of faulty cells.

However, the greatest problem of the redundancy scheme which arises from using such nonvolatile memory elements is the reliability of the element itself. If any one of the nonvolatile memory elements programmed in order to be substituted for rows or columns containing defective cells is faulty, information stored in the memory elements will be lost and the replacement of bad cells will not be performed.

OBJECTS OF THE INVENTION

Accordingly, it is an object of the present invention to provide a circuit for implementing redundancy which does not blow a fuse material, but employs a nonvolatile memory element.

It is a further object of the present invention to provide a circuit for implementing redundancy which employs a minimum number of nonvolatile memory elements.

It is another object of the present invention to provide a circuit for implementing redundancy which increases the reliability of a nonvolatile memory device storing the identity of rows or columns having bad cells.

SUMMARY OF THE INVENTION

To attain the above-mentioned objects, the present invention provides a semiconductor circuit which comprises a normal decoder inputting address signals for selecting a normal line containing normal memory cells, and a redundant decoder having one more additional address program device than the number of said address signals. The input signals of said additional address program device is complementary to input signals of one of the other address program devices, and one output signal of said two devices becomes floating in case that substitution of good cells for bad cells is unnecessary. Each address program device comprises a nonvolatile memory element, program control means for programming said memory element, and sensing means for determining whether or not said substitution will arise according to said program states of said memory elements and input signals.

To increase the reliability of redundancy, four cell nonvolatile memory devices can be employed in place of nonvolatile memory elements.

DETAILED DESCRIPTION OF THE INVENTION

Figure 1:
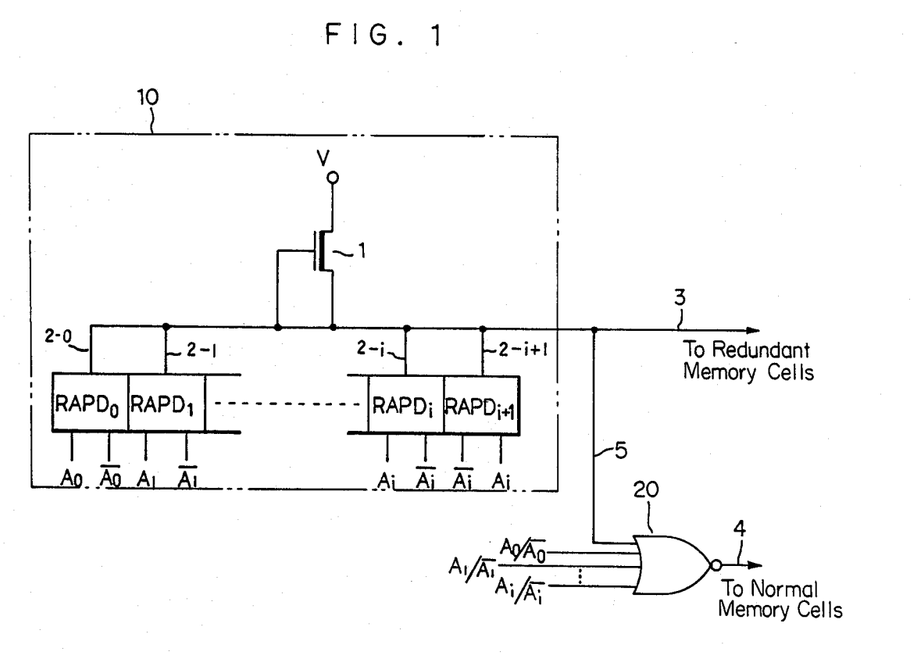
FIG. 1 is a block diagram showing the general layout of a normal row decoder and its coupling to a redundant row decoder containing row address program devices of the present invention.

FIG. 1 illustrates a redundant circuit for replacing a row line containing faulty memory cells with a redundant row line. Although the redundant circuit of FIG. 1 applies to the redundancy of the row line (often referred as "bit line"), it will be easily perceived that those skilled in the art can apply the same circuit of FIG. 1 also to a column line (often referred as "word line").

The redundant circuit as shown in FIG. 1 includes an ordinary normal decoder 20 which receives a combination of the row address signals and their complements, $A_0/\overline{A_0}, A_1/\overline{A_1}, \ldots$ and $A_i/\overline{A_i}$ ($A_k/\overline{A_k}$ means $A_k$ or $\overline{A_k}$ and represents any one of o to i) from row address buffers not illustrated and which is connected to a line 5 coupled to the redundant row line 3. The normal decoder 20 is a NOR gate used in an usual semiconductor memory device and, when all of input address signals are in logic low levels, operates so as to select memory cells connected to a normal row line 4.

A redundant row decoder 10 comprises row address program devices $RAPD_o$ to $RAPD_i$ which receive respectively pairs of a row address signal and complement $A_0, \overline{A_0}; A_1, \overline{A_1}; \ldots; A_i, \overline{A_i}$ from row address buffers (not shown) in the figure, an additional row address program device $RAPD_{i+1}$ which inputs complementary signals $\overline{A_i}, A_i$ of row address signals $A_i, \overline{A_i}$ supplied to the row address program device $RAPD_i$, a redundant row line 3 coupled together to output lines 2-0 through 2-i+1 of row address program devices $RAPD_o$ to $RAPD_{i+1}$ and a MOS transistor 1 of D type (referred to as a "D type hereinafter) operating as a driver whose gate and source are connected to the line 3 and whose drain is coupled to a supply voltage source Vcc (+5 volts).

It will be noted that the number of row address program devices $RAPD_o$ to $RAPD_{i+1}$ existes are only one more in number than the row address bit patterns in the present invention. For example, a semiconductor memory device having $2^n$ row lines of a normal memory array needs n numbers of address bit patterns to select a single row line. Therefore, the number of row address program devices in the present invention will be n+1.

Now, if we assume that one added row address program device is $RAPD_{i+1}$ as indicated in FIG. 1, input signals $\overline{A_i}$ and $A_i$ of said device $RAPD_{i+1}$ will respectively, become complementary signals of input signals $A_i$ and $\overline{A_i}$ which are supplied to the contiguous device $RAPD_i$. Therefore, if there is no need to enable the redundant row line 3 because the memory cell in the normal memory array is defect-free, the redundant row line 3 will always maintain a logic low level so as not to select the redundant memory cell. This is the reason why each signal on the output lines 2-i and 2-i+1 of row address program devices $RAPD_i$ and $RAPD_{i+1}$ has a mutually inverted logic state by reset programming of all row address program devices which will be described later in detail.

On the other hand, if the redundant row line 3 containing defect-free spare memory cells must be selected due to one or more defective normal memory cells on the line 4, row address program devices $RAPD_o$ through $RAPD_{i+1}$ will be programmed as will be described later so that all of the devices $RAPD_o$ to $RAPD_{i+1}$ become nonconductive with row address input signals selecting the normal row line 4.

Then, the redundant row line 3 is selected as a logic high level (+5 volts) by the transfer of the potential Vcc via the D type MOS transistor 1, while the normal decoder 20 is not selected by a logic low level on the normal row line 4.

Figure 2:
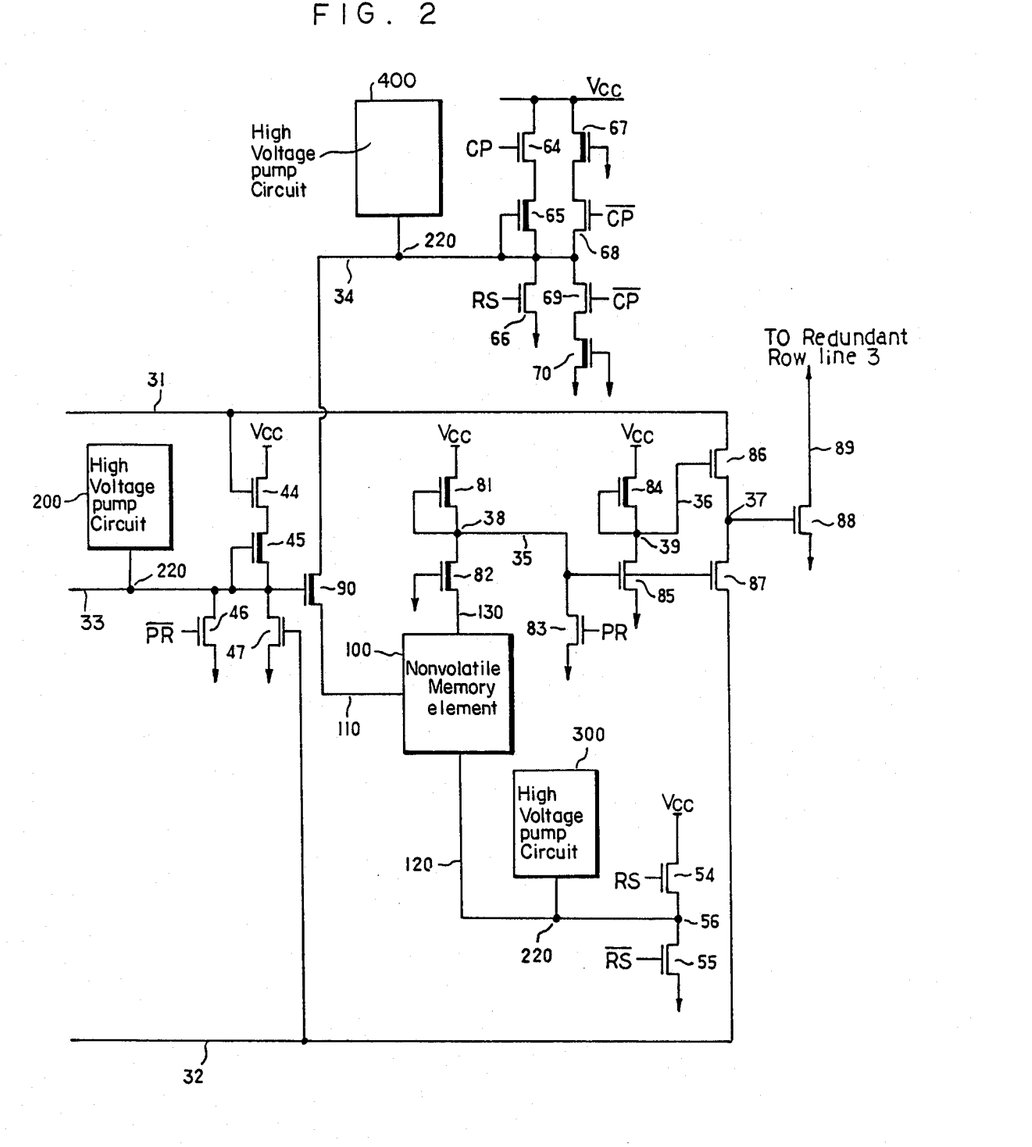
FIG. 2 is a circuit diagram showing a row address program device comprising a part of FIG. 1.

FIG. 2 illustrates one schematic circuit diagram of row address program devices $RAPD_o$ to $RAPD_{i+1}$ formed with all the same structure. The transistors are all N type enhancement or depletion MOS transistors.

The threshold voltage of the depletion MOS transistors will be about −3 volts and that of the enhancement MOS transistors will be about +3 volts. Pulse signals RS, CP and PR will be kept normally at low levels. A block 100 represents a nonvolatile memory element and each of blocks 200, 300 and 400 represent a high voltage pump circuit.

According to the present invention, an element employed at the block 100 will be a FLOTOX type nonvolatile memory element.

For the prior art of the FLOTOX type nonvolatile memory element, one can refer to "16K $E^2PROM$ Employing New Array Architecture." IEEE Journal of Solid State circuits, October 1982, pp. 833-840.

Figure 3:
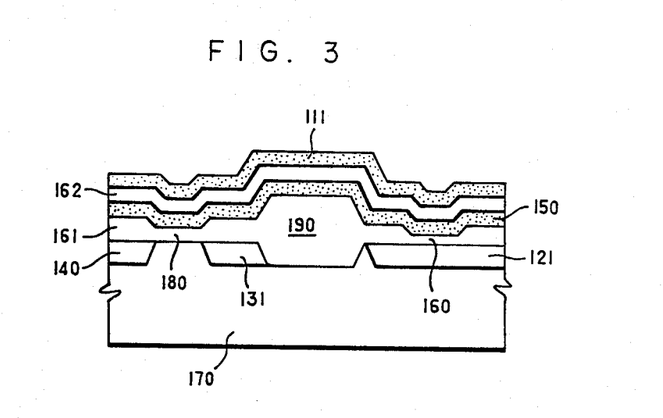
FIG. 3 is a cross-sectional view of an FLOTOX type nonvolatile memory element of the prior art.

Referring now to FIG. 3 showing the structure of the FLOTOX type nonvolatile memory element, reference numerals 170 represents a p type substrate or body, and reference numerals 140, 131 and 121 represent N+ source region, N+ drain region and N+ erase drain region, respectively. An oxide film 160 of thickness 70 Å to 200 Å on the erase drain region 121 is a tunnel oxide film. An oxide film 180 on the substrate between the source region 140 and the drain region 131 is a gate oxide film, and reference numerals 161 and 162 represent insulating films, and a first polycrystalline silicon layer 150 represents a floating gate, and a second polycrystalline silicon layer 111 represents a program gate.

Figure 4:
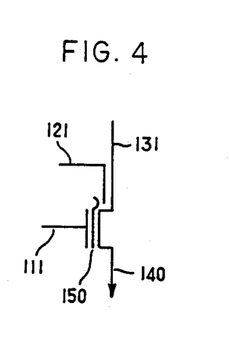
FIG. 4 is an equivalent circuit diagram of FIG. 3.

FIG. 4 is an equivalent circuit diagram of FIG. 3 and the like reference numerals in FIG. 4 are used to designate like parts to those in FIG. 3.

The writing operation of the FLOTOX type nonvolatile memory element can be accomplished by the application of positive potential Vpp (approximately +20 volts) to the program gate 111 and by grounding the erase drain 121. This potential provides an electric field across the tunnel oxide film 160 of sufficient magnitude to tunnel electrons from the erase drain 121 to the floating gate 150. Once electrons have been tunneled into the floating gate 150, the threshold voltage of the memory device becomes positive and the memory device performs the same operation as that of an ordinary enhancement mode device. That is, during the reading operation when a positive potential of approximately 2 volts is applied to the program gate 111, the memory device becomes nonconductive.

Meanwhile, to erase the memory device of FIG. 3 or FIG. 4, positive potential of Vpp is applied to the erase drain 121 while the program gate 111 is grounded. Then, electrons are tunneled into the erase drain 121 and the floating gate 150 is charged positively. Hence, the memory device operates as a depletion mode device and becomes conductive at the times of reading operation.

The program gate 111, the erase drain 121 and the drain 131 of the FLOTOX type nonvolatile memory element are connected to the line 110, 120 and 130, respectively, while the source 140 is grounded.

Figure 7:
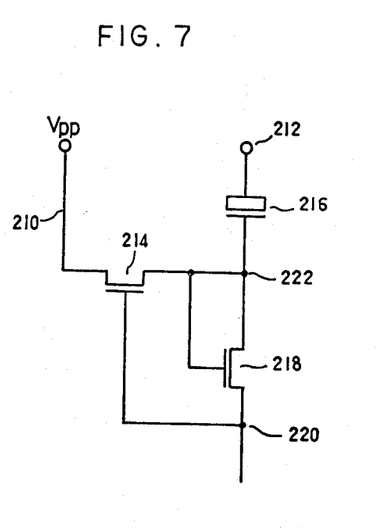
FIG. 7 is a conventional circuit diagram showing a high voltage pump circuit used as a part of FIG. 2.

FIG. 7 is a known circuit diagram, as a part of FIG. 2, showing a high voltage pump circuit.

The high voltage pump circuit comprises a MOS transistor of enhancement type (referred to as "E type" hereinafter) whose drain 210 is coupled to a positive potential of Vpp produced from a high voltage generating circuit not shown and whose source is connected to the node 222 and whose gate is coupled to the output note 220, a driver transistor formed of a E type MOS transistor 218 whose gate and drain are coupled to the node 222, and whose source is connected to the node 220, and a coupling MOS capacitor 216 whose one electrode 212 is coupled to a clock pulse $\phi$, i.e., square pulse of peak to peak 5 volts generated from a pulse generator not illustrated and whose other electrode is connected to the node 222.

When the output node 220 is floating at logic high level (+5 volts), the transfer transistor 214 for charging the clocked capacitor 216 turns on. Then the MOS capacitor 216 pumps charge into the output node 220 through the transistor 218 in response to clock pulses. Since the output node 220 is floating in this case, the voltage thereof rises to a high potential Vpp (+20 volts).

When the output node 220 is at a logic low level (ground level), the transfer transistor 214 turns off. Therefore, although clock pulse $\phi$ is applied to the MOS capacitor 216 and a little charge is transferred to the output node 220, the output node 220 will keep at a logic low level, because it is grounded.

Turning to FIG. 2, each output node 220 of high voltage pump circuits 200, 300 and 400 is connected to conductor lines 33, 120 and 34, respectively. Conductor lines 31, 32, 33, 34, 35, 36, 100, 120 and 130 may be lines made of polysilicon or metal. Between the supply voltage source of Vcc (+5 volts) and the line 34, an E type MOS transistor 64 and a D type MOS transistor 65 of which source-drain paths are connected in series are inserted. The gate of the transistor 65 is connected to the line 34 and a pulse signal CP, which goes high at the time of address program, which will be described later, is applied to the gate of the transistor 64.

Between the line 34 and the ground source, the drain-source path of an E type MOS transistor 66 is connected and a reset pulse signal RS, which goes to high at the time of reset program which will be described later, is applied to the gate of the transistor 66. Therefore, during the time of address program, the line 34 will go high (+5 volts) by the conduction of driving transistors 64 and 65 and then will go to a high potential voltage (+20 volts) by the operation of the high voltage pump circuit 400.

On the other hand, between the supply voltage source Vcc (+5 volts) and the ground source, each drain-source path of a D type MOS transistor 68 whose gate is coupled to the pulse signal CP (complement of CP), an E type MOS transistor 69 whose gate is coupled to the same signal CP as that of the transistor 68 and a D type MOS transistor 70 whose gate is grounded is connected in series. The connection node 71 of the transistors 68 and 69 is coupled to the line 34. A circuit formed of transistors 67 to 70 is a voltage reference generator, when the signal $\overline{CP}$ is a logical high state, which supplies Vcc/2 (+2.5 volts) to lines 34 and 110 during the reading operation which will be described later. Such application of voltage Vcc/2 to the line 110 makes the FLOTOX type nonvolatile memory element 100 of the depletion mode at the time of reading operation, have better conductivity.

The line 34 is connected to the line 110 via a drain-source path of a D type MOS transistor 90. The gate of the transistor 90 is coupled to the line 33. Between the supply voltage source Vcc and the line 33, an E type MOS transistor 44 and a D type MOS transistor 44 are connected in series, as indicated. The gate of the transistor 44 is connected to the line 31 on which an address signal $A_k$ delivered from address buffer (not shown) is supplied and the gate of the transistor 45 is connected to the line 33. Between the line 33 and the ground source, E type transistors 46 and 47 are connected in parallel. The gate of the transistor 46 is coupled to a pulse signal $\overline{PR}$ and the gate of the transistor 47 is connected to the line 32, on which an address signal $\overline{A_k}$, i.e. complement of the address signal $A_k$, is supplied. Therefore, at a logic low level of the signal $\overline{PR}$, if the address signal $A_k$ is high ($\overline{A_k}$ is low), the line 33 will be a high potential Vpp by the conduction of transistors 44 and 45 and then by the operation of the high voltage pump circuit 200. Meanwhile, if the address signal $A_k$ is high ($A_k$ is low), the line 33 will be in a logic low level by the ON state of the transistor 47.

At the end terminal of the line 120 connected to the erase drain 121 of FIG. 4, is connected the output node 56 of an inverter which is the ground source formed of E type MOS transistors 54 and 55 connected in series between the supply source Vcc; that circuit operates as an inverter receiving a reset signal RS and its complement RS. Therefore, by the high level of the reset signal RS at the time of reset program, the line 120 goes to a high potential Vpp by the operation of the inverter and the high voltage pump circuit 300.

Between the supply voltage source Vcc and the line 130 connected to the drain 131 of the nonvolatile memory element 100, a D type MOS transistor 81 whose gate is coupled to the node 38 and a D type MOS transistor 82 whose gate is grounded, are connected in series.

The line 35 coupled to the node 38 is connected to the drain of an E type MOS transistor 83 and the drain of the transistor 83 is connected to gates of E type transistors 85 and 87. The signal PR having a logic high level at the time of address program is applied to the gate of the transistor 83 whose source is grounded, and the transistor 83 turns on at that time. The transistor 85 and a load transistor of D type 84 connected in series at the node 39 form of an inverter. The output node 39 of the inverter is connected to the gate of an E type MOS transistor 86 via the line 36. Each drain-source path of transistors 86 and 87 is connected in series between lines 31 and 32 via a node 37, as indicated.

The node 37 is connected to the gate of a E type MOS transistor 88 whose source is grounded and a drain line 89 of the transistor 88 is the output line coupled to the redundant row line 3.

A circuit comprising transistors 81 to 88 operates during the reading operation as a sensing circuit for determining whether a redundant row line will be selected according to the programmed state of the nonvolatile memory element 100 or not. That is, if the nonvolatile memory element 100 is programmed as a depletion mode element and the row address signal $A_k$ on the line 31 is at a logic low level, the potential of the node 38 will be low (ground) by the conduction of the element and by the signal PR provided as a logic low level during the reading operation. Then, the transistors 85 and 87 become OFF and the transistor 86 goes ON. Therefore, the node 37 becomes logic low and the redundant row line 3 connected to the line 89 becomes logic high so as to select the redundant memory cell.

However, if the row address signal $A_k$ had logic high level at that time, the node 37 would be at a logic high level and, as a result, redundant memory cells connected to the redundant row line 3 would not be selected but normal memory cells connected to the normal row line 4 would be selected.

On the other hand, if the nonvolatile memory element 100 was programmed as an enhancement mode element, the node 38 would be at a logic high level by the nonconduction of the element 100. Therefore, if the complementary row address signal $\overline{A_k}$ has a logic low level, the redundant row line 3 will be selected by the conduction of the transistor 87.

Description will now be given in detail, with reference to FIGS. 1 and 2., of the operation of the present invention.

Programming steps of the row address program devices $RAPD_o$ to $RAPD_{i+1}$ for the substitution of good cells for defective cells can be divided into two steps of a reset program and an address program.

The reset program performing at the same time on all of the row address program devices $RAPD_o$ to $RAPD_{i+1}$ after the test of the memory array is to program all nonvolatile memory elements so as to operate them as depletion modes. Such reset program is began by setting only a reset signal RS of program control signals RS, CP and PR at a logic high level. Then, transistors 46, 54 and 66 are rendered conductive. Hence, lines 33, 34 and 110 are discharged into logic low levels and the line 120 are charged to a high potential Vpp by the operation of the high voltage pump circuit 300 as described above. As a result, all nonvolatile memory elements in row address program devices $RAPD_o$ to $RAPD_{i+1}$ are fixed into depletion mode elements due to the high potential Vpp applied to the erase drain 121 and the ground potential applied to the program gate 111.

After the completion of the above mentioned reset program step, an address program step for substituting redundant memory cells is performed. The address program step is to program the row address program devices $RAPD_o$ to $RAPD_{i+1}$ so as to select the redundant row line by causing the address bit pattern selecting the normal row line to input to the above devices. The address program is divided into two cases; one is the case that the row address signal $A_k$ is low, and the other is the case that the row address signal $A_k$ is high.

In any case, program control signals PR and CP are set at logic high levels and the reset signal RS is set at a logic low level. Therefore, the line 120 will become logic low by the conduction of the transistor 55 and the line 34 will be charged to a high potential Vpp by the conduction of transistors 64 and 65, and by the operation of the high voltage pump circuit 400.

At this time, if an row address signal $A_k$ on the line 31 has a logic low level (complementary signal $\overline{A_k}$ of the signal $A_k$ has a logic high level), the transistor 44 will become OFF and the transistor 47 will become ON. Then, the line 33 will be discharged to the ground state. Therefore, the isolation transistor 90 transfers only a part of the high potential Vpp (+20 volts) on the line 110. As a result, the line 110 will provide a potential of approximately 3 volts on the program gate 111. Accordingly, since this potential can not provide an electric field of sufficient magnitude to cause the memory element 100 to change the program state, the memory element 100 will be maintained in the same depletion mode as that of the above mentioned reset programming time.

If a row address signal $A_k$ on the line 31 has a logic high level, the transistor 44 and 45 will become conductive, and then the line 33 will have a high potential Vpp by the operation of the high voltage pump circuit 200. Therefore, a potential of the line 110 will acquire a high potential Vpp by the conduction of the transistor 90. As a result, the nonvolatile memory element 100 will be changed into an enhancement mode element.

Once the above mentioned program steps are completely finished, at the time of reading operation, the redundant row decoder 10 must operate so as to select the redundant row line 3 in place of the defective normal row line 4. Such a reading operation is performed by the sensing circuit formed of transistors 81 to 88. At this time, signals CP, RS and PR are all in logic low levels, that is, in normal state. Therefore, lines 110 and 120 are all at logic low levels. If the nonvolatile memory element 100 is programmed as a depletion mode element, the node 38 will be at a logic low level, and then the transistor 86 will turn on, while the transistor 87 is OFF. Hence, the logic low level of the address signal $A_k$ appears at the node 37 and the transistor 88 becomes OFF, and then the redundant row line is selected. If the nonvolatile memory element 100 is programmed as an enhancement mode element, the transistor 86 will be OFF, while the transistor 87 is ON. Therefore, the redundant row line is selected by the logic low level of the address signal $\overline{A_k}$.

Therefore, if the memory cells connected to the normal row line 4 are free of defects, any one of output signals of row address program devices $RAPD_i$ and $RAPD_{i+1}$ will be placed in a logic low level by the above mentioned reset program. Hence, the redundant row line 3 maintains a logic low level so as not to be selected.

If the memory cells on the normal row line 4 are defective, one or more row address program devices of which input row address signal $A_k$ ($C_k$ represents one of o to i) has a logic low level will be programmed as depletion modes, while row address program devices of which input row address signal $A_k$ has a logic high level will be programmed as enhancement modes.

Though the above description gives an example of using one FLOTOX type nonvolatile memory element, if the element is defective, the redundancy plan will be unsuccessful. To solve the above mentioned problem, a four cell FLOTOX type nonvolatile memory element which connected as a bridge type can be used in block 100 of FIG. 2.

Figure 5:
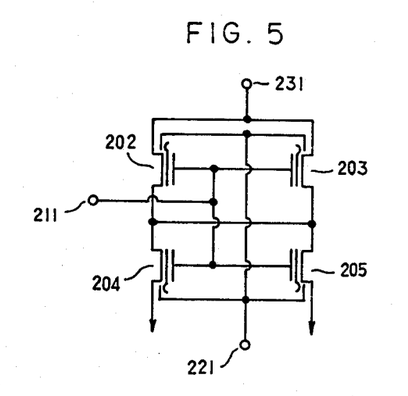
FIG. 5 is a circuit diagram of four cell bridge connection FLOTOX type nonvolatile memory elements used in a row address program device according to the present invention.

Referring to FIG. 5, program gates of FLOTOX type nonvolatile memory elements 202 to 205 are all coupled to a program gate terminal 211, and erase drains of the elements 202 to 205 are all connected to a erase drain terminal 221. Drains of the elements 202 and 203 are all coupled to a drain terminal 231. Sources of the elements 202 and 203 are all connected together with drains of the elements 204 and 205. Sources of the elements 204 and 205 are all grounded to the program gate terminal 211, the erase drain terminal 221 and the drain terminal 231 are connected to the lines 110, 120 and 130, respectively. The four cell FLOTOX type nonvolatile memory element performs the same operation as that of the FLOTOX type nonvolatile memory element shown in FIGS. 3 and 4.

The four cell FLOTOX type nonvolatile memory element shown in FIG. 5 can not function, if at least two of four elements 202 to 205 are defective. Therefore, the probability, $P_T$, that the four cell FLOTOX type nonvolatile memory element is defective can be given by the following equation.

$$P_T = 2P^2(1-P^2) + 4P^3(1-P) + P^4 + 2P^2$$

wherein P is the probability that one cell FLOTOX nonvolatile memory element illustrated in FIGS. 3 and 4 produces a defect during the manufacturing process.

Generally, since the value of P is a small value of approximately $10^{-5}$, the reliability of the four cell element shown in FIG. 5 will change on the order of $10^{-5}$ rather than that of one the cell element illustrated in FIGS. 3 and 4.

Figure 6:
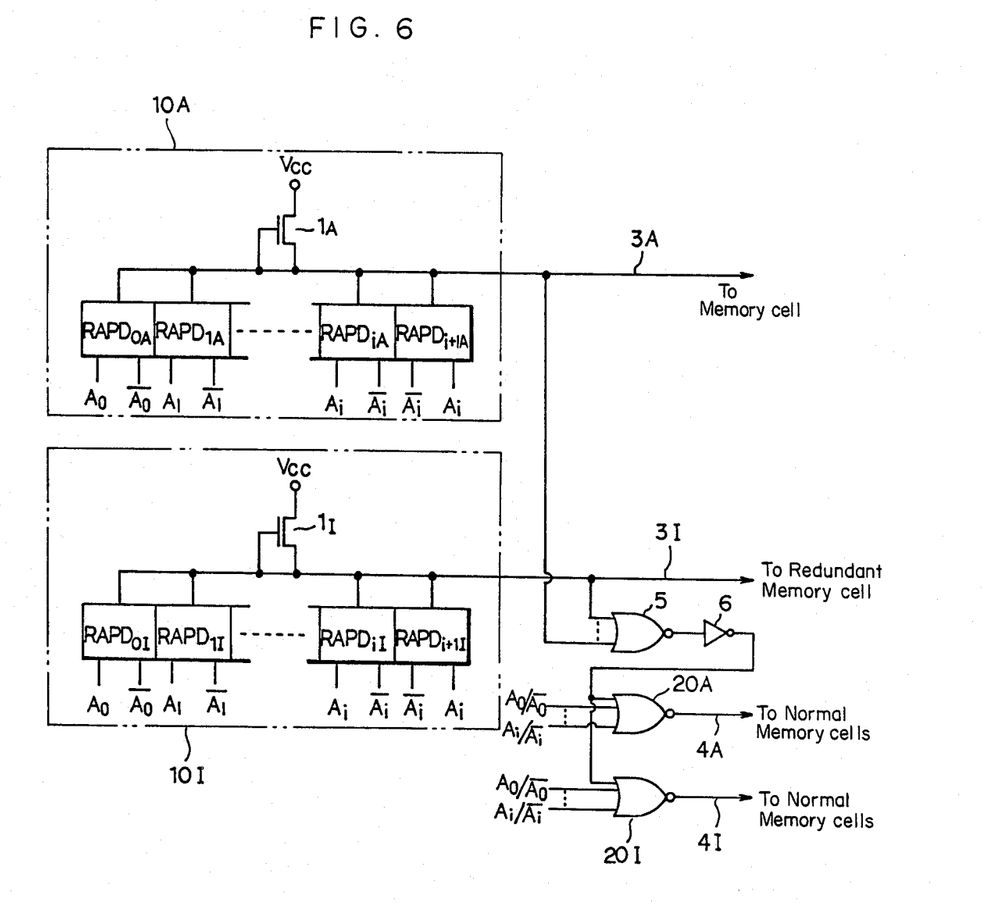
FIG. 6 is a redundant circuit diagram showing a plurality of normal row decoders and their coupling to redundant row decoders.

FIG. 6 shows a redundancy circuit diagram substituting a plurality of redundant row lines for a plurality of normal row lines. In FIG. 6, each of redundant row decoders 10A to 10I has the same structure as that of the redundant row decoder 10 illustrated in FIG. 1. and normal decoders 20A to 20I is known NOR gate decoders.

Now, if we assume that normal memory cells on the normal row line 4a had defects, row address program devices $RAPD_{0A}$ $RAPD_{i+1A}$ were programmed so as to repair the bad cells by the address program, and row address signals for selecting the normal memory cells on the line 4a were delivered to the semiconductor chip according to the present invention, the signal on the redundant row line 3A would become a logic high level. Then, the output signal of a NAND gate formed of a NOR gate 5 and a inverter 6, which inputs signals on redundant row lines 3A to 3I, will be at a logic high level. Therefore, all output signals of the normal row decoders 20A to 20I connected to the output of the NAND gate will become logic low levels so as not to select the normal memory cells on the normal row lines 4A to 4I.

If all memory cells of the normal memory array are free of defect, by the reset program as mentioned above, all redundant row lines 3A to 3I will be at a logic low level so as not to select redundant memory cells.

While the present invention has been described in a preferred embodiment, it will be apparent to those skilled in the art that the disclosed invention may be modified in numerous ways and may assume embodiments other than that specifically set out and described above. For example, input signals of the additional address program device can be complementary signals of input signals of selected one device of other address program devices. Accordingly, it is intended by the appended claims to cover all modifications of the invention which fall within the true spirit and scope of the invention.

What is claimed is:

1. In a semiconductor circuit for substituting a redundant line connected to defect-free redundant memory cells for a normal line connected to defective normal memory cells, wherein the circuit has a normal decoder connected to the normal line, for producing a first resulting signal to enable or disable the normal line connected to the defective normal memory cells in response to a predetermined combination of address signals of the normal decoder and their complements, said redundant decoder comprising:

a plurality of first address program devices, connected in parallel to the redundant line, for electrically connecting or disconnecting the redundant line to a reference potential in response to pairs of input signals formed by each input address signal and the respective complement of each input address signal during a first electrical program of said devices; and a second address program device, connected to the redundant line, for electrically connecting or disconnecting the redundant line to the reference potential in response to a pair of signals complementary to a pair of input signals of one selected device of said plurality of first devices during a second electrical program of said second address program device whereby any one of said one selected device and said second device connect to the reference potential so as to not select the redundant line during said first program when the normal memory cells are free of defect, and said first and second devices become floating, and so as to select the redundant line during the second program when the normal memory cells are defective.

2. The circuit of claim 1 wherein each address program device comprises:

a true address signal line;

a complementary address signal line;

a nonvolatile memory element having a program gate terminal, erase drain terminal, a second drain terminal and source terminal at a common potential;

first means connected to said program gate terminal through an isolation transistor, for producing a first potential at the time of said first program and supplying a predetermined potential to said program gates so that said memory element has better conduction during a reading operation;

second means connected to said erase drain terminal, for producing a first potential at the time of said first program;

third means connected between said true address signal line and an input terminal of the isolation transistor, and between said complementary address signal line and the input terminal of the isolation transistor, for supplying a sufficiently high potential to the input terminal so that the first potential produced by the first means during said second program transfers to said program gate when said true address signal is true, thereby causing a change in the program state of said memory element which was set at the time of said first program, and producing a low potential at said input terminal during said first program when said true address signal is complementary, thereby causing not to change the program state of said memory element which was set at the time of said first program; and sensing means connecting between said second drain terminal and said true address signal line and said complementary address signal line, for connecting an output line connected to said redundant line to said reference potential when said true address line is true, and floating said output line when said true address is complementary.

3. The circuit of claim 2, wherein said nonvolatile memory element comprises:

a plurality of nonvolatile memory devices having program gates and erase drains connected together with said program gate terminal and said erase drain terminal, respectively, having drains connected in parallel and connected to said drain terminal and having source-drain junction points connected in series and connected together, and having other sources connected to the reference potential.

4. The circuit of claim 3, wherein said nonvolatile memory element is a FLOTOX type nonvolatile memory device.

5. The circuit of claim 3, wherein said first, second and third means each comprise a high voltage pump circuit.

6. The circuit of claim 2, wherein said nonvolatile memory element is a FLOTOX type nonvolatile memory device.

7. The circuit of claim 2, wherein said first, second and third means each comprise a high voltage pump circuit.

8. The circuit of claim 1, wherein each address program device comprises:
- a nonvolatile memory element having a first drain terminal, erase drain terminal and program gate terminal;
- said memory element including a plurality of semiconducting devices each having a program gate electrode coupled to said program gate terminal, a first drain electrode, an erase drain electrode coupled to said erase drain terminal, and a source electrode;
- first drain electrodes of third and fourth ones of said plurality of semiconducting devices being coupled together and to source electrodes of said first and second ones of said plurality of semiconducting devices, and
- source electrodes of said third and fourth ones of said plurality of semiconducting devices being coupled to said reference potential.

9. In a semiconductor circuit for substituting a redundant line connected to defect-free redundant memory cells for a normal line connected to defective normal memory cells, wherein the circuit has a normal decoder connected to the normal line, for selecting the normal line identified by a predetermined combination of address signals and their complements, and a redundant decoder connected to the redundant line, for selecting the redundant line in response to the address signals and their complements, said redundant line connected to the normal decoder so as to prevent selection of the normal line upon selection of the redundant line, the redundant decoder comprising:
- a plurality of first address program devices connected in parallel between a reference potential and the redundant line, for connecting or disconnecting the redundant line to the reference potential in response to pairs of input signals formed by each input address signal and the respective complement of each input address signal; and
- a second address program device connected in parallel with said first program devices between the reference potential and the redundant line, for connecting or disconnecting the redundant line to the reference potential in response to a pair of signals complementary to a pair of said input signals for one selected device of said plurality of first devices;
- whereby, in a first programmed mode, any one of said one selected first program device and said second program device connects the redundant line to the reference potential so as to deselect the redundant line and select the normal line and, in a second programmed mode accommodating occurrence of defective normal memory cells, each program device disconnects the redundant line to the reference potential so as to select the redundant line.

10. The circuit of claim 9 wherein each address program device comprises:
- a true address signal line for receiving the input signals of each first address program device and said pair of signals complementary to said pair of input signals for one selected device of the second address program device;
- a complementary address signal line for receiving a signal complementary to the input signal of the true address signal line;
- a nonvolatile memory element having a program gate terminal, an erase drain terminal, a drain terminal and a source terminal at a ground potential;
- first means connected to the erase terminal, for producing a high potential in the first program mode and said reference potential in the second program mode;
- second means connected between the program gate terminal and the true address signal line and the complementary address signal line, for supplying said reference potential to the program gate in the first program mode and providing a high potential to the program gate when the true address signal line is coupled to a first logic level in the second program mode, thereby causing to change a first program state, and for maintaining the first program state of said memory element when the true address signal line is coupled to a second logic level in the second program mode; and
- sensing means connected between the drain terminal and the true address signal line and the complement address signal line, for grounding an output line connected to the redundant line at the first program state of said memory element when said true address line is coupled to a first logic level, and floating said output line at the second program state of said memory element when said true address line is coupled to a second logic level.

11. The circuit of claim 10 wherein the first program state and the second program state of said memory element are respectively a depletion mode and an enhancement mode.

12. The circuit of claim 9, wherein each address program device comprises:
- a nonvolatile memory element having a first drain terminal, erase drain terminal and program gate terminal;
- said memory element including a plurality of semiconducting devices each having a program gate electrode coupled to said program gate terminal, a first drain electrode, an erase drain electrode coupled to said erase drain terminal, and a source electrode;
- first drain electrodes of first and second ones of said plurality of semiconducting devices being coupled to said first drain terminal;
- first drain electrodes of third and fourth ones of said plurality of semiconducting devices being coupled together and to source electrodes of said first and second ones of said plurality of semiconducting devices; and
- source electrodes of said third and fourth ones of said plurality of semiconducting devices being coupled to said reference potential.

13. In a semiconductor circuit for substituting a redundant line coupled to defect-free redundant memory cells for a normal line coupled to defective normal memory cells, wherein said circuit includes address means for providing address signals and their complements, a normal decoder connected between address means and the normal line, for selecting the normal line in response to a predetermined combination of address signals and their complements, and a redundant decoder connected between address means and the redundant line, for selecting the redundant line in response to signals provided by said address means, said redundant decoder connected to the normal decoder to prevent selection of the normal line upon selection of the redundant line, the redundant decoder comprising:

first address program devices connected in parallel between the redundant line and a reference potential and receiving said address signals and their complements, each first address program device having a programmable element capable of assuming a first address program devices causing respectively connection and disconnection of the redundant line to the reference potential in response to a first logic state and a second logic state of a respective one of said address signals, and the second program state of each of said first address program devices causing respectively connection and disconnection of the redundant line to the ground source in response to the first logic state and the second logic state of a respective one of said complementary address signals; and a second address program device connected in parallel with said first address program devices between the redundant line and the ground source and receiving input signals which are complementary to those of a selected one of said first address program devices, said second address program device having one said programmable element, the first program state of said second address program device causing respectively connection and disconnection of the redundant line to the reference potential in response to the first logic state and the second logic state of the address signal of said selected one of said first address program devices;

whereby, all of said first address program devices and said second address program device may be initially programmed in first program state when said normal memory cells are free of defect, wherein any one of said one selected address program devices and said second address program device is connected to the reference potential so as to not select the redundant line, and, each of said first program devices and said second address program device receiving address signals of the first logic state may be programmed in said second program state when said normal memory cells are not free of defect, wherein all of said address program devices are disconnected from the reference potential so as to select the redundant line.

14. The circuit of claim 13 wherein said nonvolatile memory element and said first and second program states are respectively a depletion mode and an enhancement mode.

15. The circuit of claim 14 wherein said nonvolatile memory element is FLOTOX type nonvolatile memory element and each address program device comprises means for programming said first address program devices and said second address program device in said depletion mode and said enhancement mode.

16. The circuit of claim 13, wherein each programmable element comprises:

a nonvolatile memory element having a first drain terminal, erase drain terminal and program gate terminal;

said memory element including a plurality of semiconducting devices each having a program gate electrode coupled to said program gate terminal, a first drain electrode, an erase drain electrode coupled to said erase drain terminal, and a source electrode;

first drain electrodes of first and second ones of said plurality of semiconducting devices being coupled to said first drain terminal;

first drain electrodes of third and fourth ones of said plurality of semiconducting devices being coupled together and to source electrodes of said first and second ones of said plurality of semiconducting devices; and source electrodes of said third and fourth ones of said plurality of semiconducting devices being coupled to said reference potential.

17. A monolethic integrated semiconductor memory chip, comprising:

a normal address line connected to a plurality of normal memory cells;

a redundant address line connected to a plurality of redundant memory cells; and a redundant address decoder, including:

a plurality of first address program means coupled in parallel to the redundant address line, for electrically connecting or disconnecting the redundant address line to a reference potential in response to pairs of each input address signal and complement of each input address signal during a first electrical program of said first address program means; and second address program means connected in parallel with said first address program means to the redundant address line for electrically connecting or disconnecting the redundant address line to a reference potential in response to a pair of signals complementary to a selected one of said pairs of each address signal and complement during a second electrical program of said second address program means.

18. The circuit of claim 17, wherein each of said plurality of first address program means and said second address program means comprises:

a true address line;

a complementary address line;

a nonvolatile memory element having a program gate terminal, first erase drain terminal, a second drain terminal, and a source terminal coupled to a reference potential;

potential providing means connected to said program gate terminal through an isolation transistor, for producing a first potential at the time of said second program, a second and lower potential at the time of said first program, and supplying a predetermined potential to said program gates, said potential providing means being connected to said erase drain terminal, for producing a first potential at the time of said first program; and said potential providing means being connected between said true address signal line and an input terminal of the isolation transistor, and between said complementary address signal line and the input terminal of the isolation transistor, for supplying a sufficiently high potential to the input terminal so that the first potential produced by said providing means during said second program transfers to said program gate when said true address signal is true, thereby causing a change in the program state of said memory element which was set at the time of said first program, and producing a low potential at said input terminal during said first program when said true address signal is complementary, thereby causing not to change the program state of said memory element which was set at the time of said first program; and sensing means connected between said second drain terminal and said true address signal line and said complementary address signal line, for coupling an output line connected to said redundant address line to said reference potential when said true address line is true, and floating said output line when said address is complementary.

19. The circuit of claim 17, wherein each of said first address program means and said second address program means comprises:

a nonvolatile memory element having a first drain terminal, erase drain terminal and program gate terminal;

said memory element including a plurality of semiconducting devices each having a program gate electrode coupled to said program gate terminal, a first drain electrode, an erase drain electrode coupled to said erase drain terminal, and a source electrode;

first drain electrodes of first and second ones of said plurality of semiconducting devices being coupled to said first drain terminal;

first drain electrodes of third and fourth ones of said plurality of semiconducting devices being coupled together and to source electrodes of said first and second ones of said plurality of semiconducting devices; and source electrodes of said third and fourth ones of said plurality of semiconducting devices being coupled to said reference potential.

* * * * *